(12) United States Patent
Furukawa (10) Patent No.: US 6,638,873 B2
(45) Date of Patent: Oct. 28, 2003

(54) SEMICONDUCTOR DEVICE PRODUCING METHOD (75) Inventor: Yukihiko Furukawa, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 10/270,078

(22) Filed: Oct. 15, 2002

(65) Prior Publication Data
US 2003/0092286 A1 May 15, 2003

(30) Foreign Application Priority Data
Oct. 16, 2001 (JP) ........................ 2001-317666

(51) Int. Cl.[7] ................. H01L 21/302; H01L 21/463
(52) U.S. Cl. ................. 438/706; 438/763; 438/787; 438/788; 438/780
(58) Field of Search ................. 438/584, 706, 438/631, 763, 637, 656, 778, 790, 783, 780, 535, 536, 787, 788, 740, 743

(56) References Cited

U.S. PATENT DOCUMENTS 5,526,867 A * 6/1996 Keck et al. .................. 164/97
6,303,266 B1 * 10/2001 Okino et al. ............. 430/270.1
6,399,512 B1 * 6/2002 Blosse et al. ............... 438/723
6,458,516 B1 * 10/2002 Ye et al. .................... 430/317
6,503,818 B1 * 1/2003 Jang .......................... 438/584
2002/0076935 A1 * 6/2002 Maex et al. ................ 438/706
2002/0176475 A1 * 11/2002 Sai et al. ...................... 372/96
2002/0177013 A1 * 11/2002 Hiramoto et al. ........... 428/702

* cited by examiner

Primary Examiner—Michael S. Lebentritt
(74) Attorney, Agent, or Firm—Armstrong, Westerman & Hattori, LLP (57) ABSTRACT A semiconductor device producing method carries out an etching process during a time between a start and an end of a plasma etching, and carries out a plasma etching with respect to a specific metal as a pre-processing prior to the etching process. The etching process is selected from a group consisting of an etching process which includes no exposing of a specific metal which affects variation of an etching rate, an etching process which includes no positioning of the specific metal exposed from an etching mask, an etching process which includes exposing of the specific metal located at a surface other than an etching target surface of a semiconductor substrate, and an etching process which includes exposing the specific metal having a thickness smaller than a thickness of other etching targets regardless of an existence of the etching mask.

28 Claims, 10 Drawing Sheets

SEMICONDUCTOR DEVICE PRODUCING METHOD

BACKGROUND OF THE INVENTION

This application claims the benefit of a Japanese Patent Application No. 2001-317666 filed Oct. 16, 2001, in the Japanese Patent Office, the disclosure of which is hereby incorporated by reference.

1. Field of the Invention

The present invention generally relates to semiconductor device producing methods, and more particularly to a semiconductor device producing method which is characterized by a pre-processing for preventing a variation in an etching rate when selectively etching a barrier metal underlayer such as a wiring layer.

2. Description of the Related Art

Recently, due to increased integration density of semiconductor devices, there are demands to further increase the accuracy of patterns. In order to satisfy such demands, it is necessary to realize a dry etching technique which can accurately and stable etch the patterns.

A description will be given of an example of a conventional wiring layer forming process, by referring to FIGS. 1 through 4. FIGS. 1 through 4 are cross sectional views for explaining this example of the conventional wiring layer forming process. For the sake of convenience, it is assumed that the etching process is carried out with respect to a TiW barrier metal layer using an induced combination plasma (ICP) etching apparatus.

Figure 1:
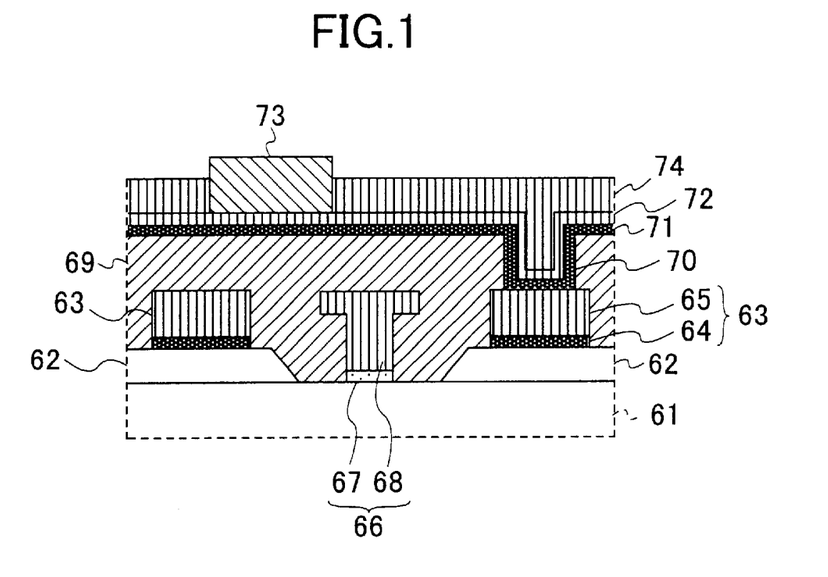
FIG. 1 is a cross sectional view for explaining an example of a conventional wiring layer forming process.

First, as shown in FIG. 1, an i-type (intrinsic) AlGaAs buffer layer (not shown) is formed on a semiinsulating GaAs substrate (not shown). On this i-type AlGaAs buffer layer, an i-type InGaAs electron transit layer (not shown), an n-type AlGaAs electron supply layer 61 and an n-type GaAs cap layer 62 are successively grown epitaxially. A source/drain electrode 63 made up of a AuGe layer 64 and a Au layer 65 is formed on the n-type GaAs cap layer 62. Then, after forming a gate recess region, a T-shaped gate electrode 66 made up of a Pt layer 67 and a Au layer 68 is formed on the n-type AlGaAs electron supply layer 61. A polyimide layer 69 covers the entire surface of this structure, as an interlayer insulation layer.

Next, an ICP etching is carried out to selectively etch the polyimide layer 69, so as to form a contact hole 70 which reaches the source/drain electrode 63. Thereafter, a TiW layer 71 which forms a barrier metal and a Au seed layer 72 which forms a plating seed are successively sputtered.

Further, an electroplating is carried out by using a resist pattern 73 as a plating frame, so as to selectively form a Au wiring layer 74.

Figure 2:
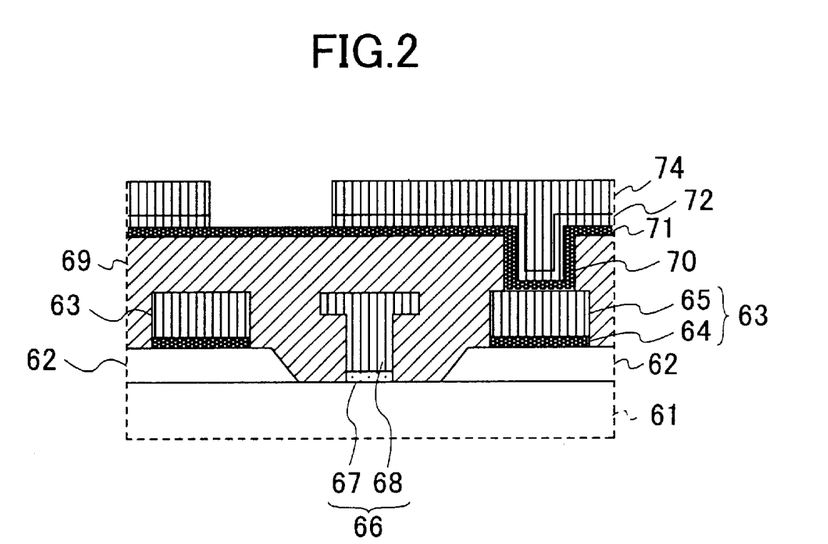
FIG. 2 is a cross sectional view for explaining the example of the conventional wiring layer forming process.

Next, as shown in FIG. 2, an ion milling apparatus is used to remove by an Ar ion milling the Au seed layer 72 which is exposed at a region where the Au wiring layer 74 is not provided.

Figure 3:
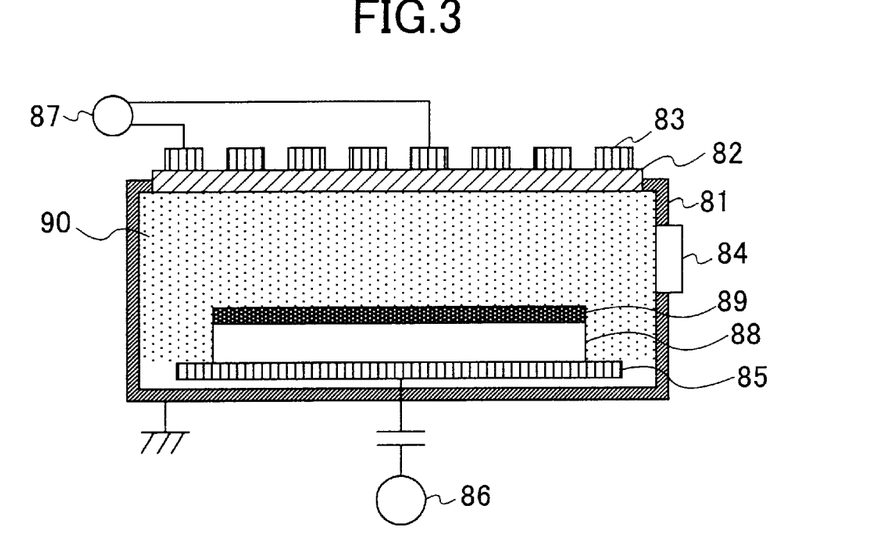
FIG. 3 is a cross sectional view for explaining the example of the conventional wiring layer forming process.

Then, after cleaning the ICP etching apparatus, the ICP etching apparatus is run using a dummy wafer 88 provided with a TiW layer 89 which becomes an etching target, in FIG. 3.

The ICP etching apparatus includes an etching reaction chamber 81 which is provided with a quartz plate 82 for supporting a planar coil 83 and a quartz window 84 which forms an observation port. A stage 85, which is also functions as an electrode on which the sample is placed, is accommodated within the etching reaction chamber 81.

The etching reaction chamber 81 is grounded, and a high-frequency power for plasma excitation is applied to the planar coil 83 from an excitation RF power supply 87. On the other hand, a bias power from a bias RF power supply 86 is applied to the stage 85.

During this running process, the dummy wafer 88 used is provided with the TiW layer 89 which is the same as the etching target of the etching process, and the TiW layer 89 is etched by introducing a $SF_6$ gas into the etching reaction chamber 81 and generating plasma 90 by the excitation RF power supply 87.

Next, the dummy wafer 88 is removed from the etching reaction chamber 81 in FIG. 3, and the semiconductor wafer having the exposed portion of the TiW layer 71 is placed on the stage 85. Then, a $SF_6$ gas is introduced into the etching reaction chamber 81 and the plasma 90 is generated by the excitation RF power supply 87. Hence, the exposed TiW layer 71 is selectively etched by the generated plasma, so as to separate the Au wiring layer 74 into portions which are electrically isolated from each other as shown in FIG. 4.

However, when the etching of the TiW barrier metal is carried out a number of times on this ICP etching apparatus, there is a problem in that the etching rate initially varies suddenly, thereby making it difficult to realize a stable etching. This problem will now be described by referring to FIGS. 5 and 6.

Figure 4:
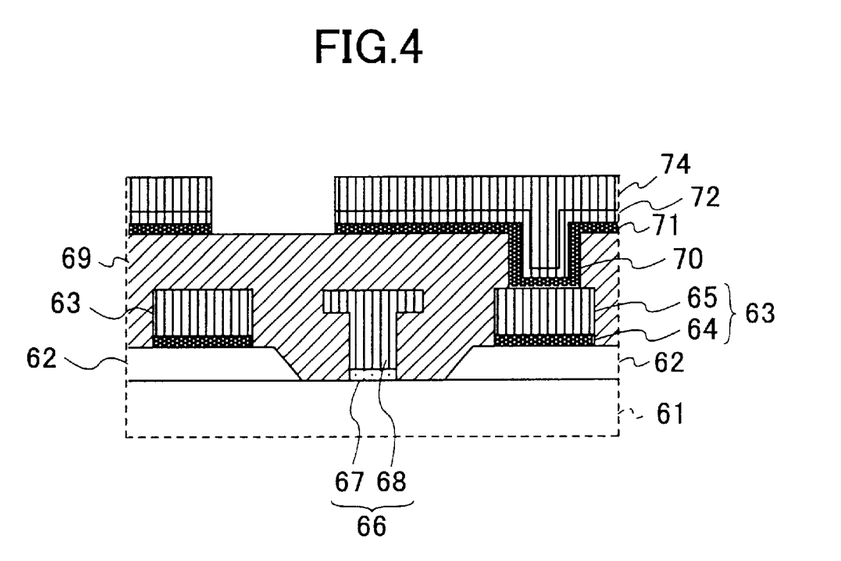
FIG. 4 is a cross sectional view for explaining the example of the conventional wiring layer forming process.
Figure 5:
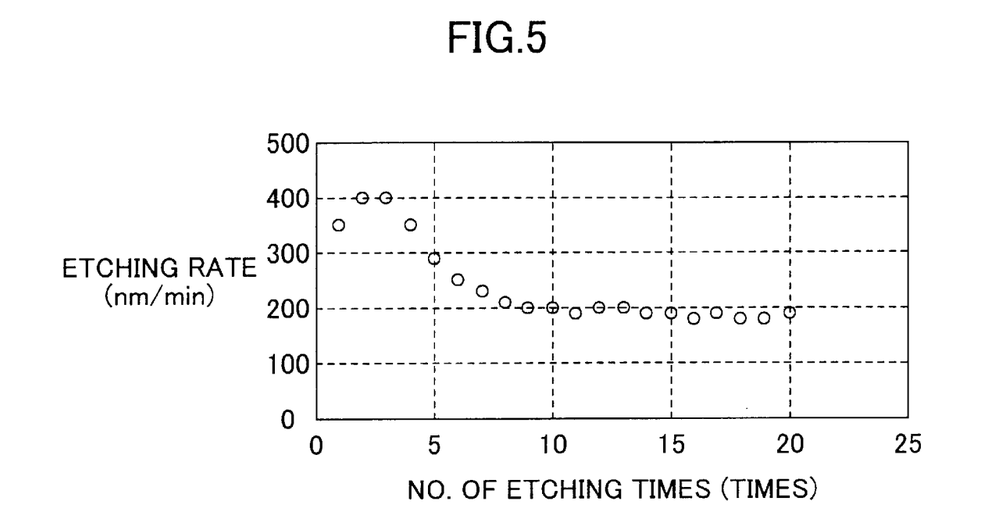
FIG. 5 is a diagram for explaining a dependency of the etching rate on a number of times of the etching carried out when the etching of a TiW barrier metal shown in FIG. 4 is repeated.

FIG. 5 is a diagram for explaining a dependency of the etching rate on a number of times of the etching carried out when the etching of the TiW barrier metal shown in FIG. 4 is repeated. In FIG. 5, the ordinate indicates the etching rate (nm/min), and the abscissa indicates the number of etchings (time), that is, the number of times of the etching carried out.

It may be seen from FIG. 5 that the etching rate initially varies suddenly, but thereafter enters a stable region. FIG. 5 shows a case where the etching is carried out for 1 minute for each time of the etching carried out. In FIG. 5, it may be seen that the etching rate after 10 etchings is approximately ½ the initial etching rate.

Figure 6:
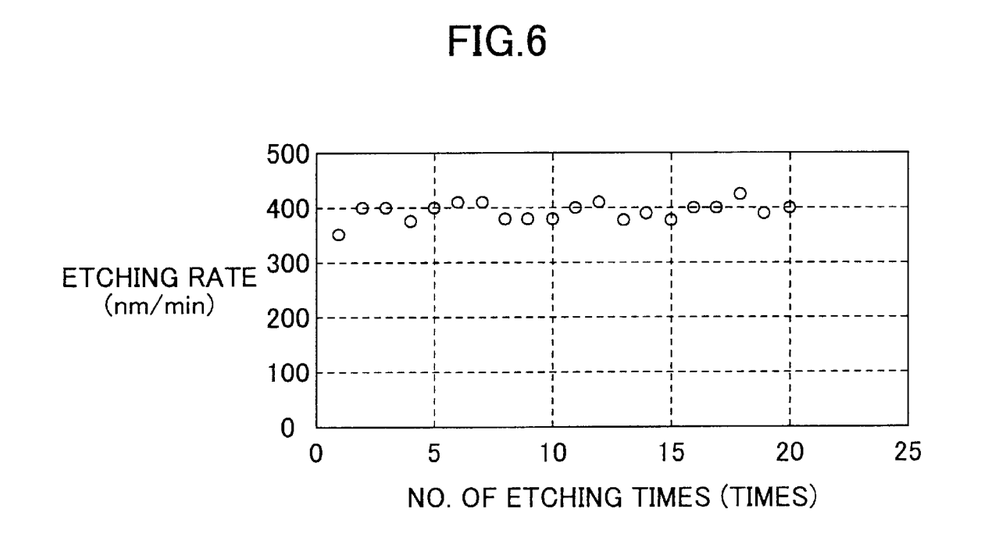
FIG. 6 is a diagram for explaining a dependency of the etching rate on a number of times of the etching carried out when the etching of only the TiW barrier metal which does not involve exposure of a Au layer is repeated.

FIG. 6 is a diagram for explaining a dependency of the etching rate on a number of times of the etching carried out when the etching of only the TiW barrier metal which does not involve exposure of the Au layer is repeated. In FIG. 6, the ordinate indicates the etching rate (nm/min), and the abscissa indicates the number of etching times (times), that is, the number of times of the etching carried out.

It may be seen from FIG. 6 that the etching rate dot not vary suddenly.

From a comparison of FIGS. 5 and 6, it may be regarded that the sudden variation in the initial etching rate is caused due to the Au wiring layer 74 and the Au seed layer 72 which are exposed during the etching process carried out with respect to the TiW layer 71. In other words, since the Au wiring layer 74 and the Au seed layer 72 are exposed during the etching process carried out with respect to the TiW layer 71, it may be regarded that the exposed portion of Au scatters into the etching reaction chamber 81 to cause deterioration of the etching rate.

The tendency of the etching rate varying suddenly when the Au is exposed can similarly be observed for other metals which are exposed, such as Pt, Cu and Al.

The above described process of forming the wiring layer uses the selective plating. However, the sudden variation of the etching rate similarly occurs when the entire wiring layer is formed by sputtering or the like and an etching is carried out using a resist pattern as a mask to form the wiring pattern. In this case, a side edge portion of the Au wiring layer immediately under the resist pattern is exposed at the etching portion, and thus, it may be regarded that the Au scatters into the etching reaction chamber from this exposed side edge portion to thereby cause the sudden variation in the etching rate.

The sudden variation of the etching rate described above is not limited to the etching process with respect to the barrier metal. As will be described in conjunction with FIGS. 7 and 8, the sudden variation of the etching rate also occurs during the process of forming the contact hole in the interlayer insulation layer such as the polyimide layer 69 shown in FIG. 1.

Figure 7:
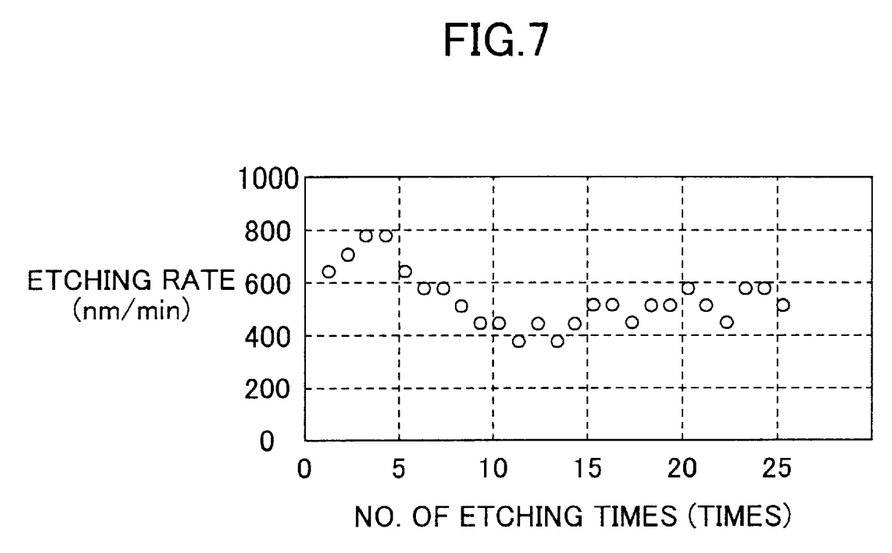
FIG. 7 is a diagram for explaining a dependency of the etching rate on a number of times of the etching carried out when forming the contact hole in FIG. 1 is repeated.

FIG. 7 is a diagram for explaining a dependency of the etching rate on a number of times of the etching carried out when the process of forming the contact hole in FIG. 1 is repeated. In FIG. 7, the ordinate indicates the etching rate (nm/min), and the abscissa indicates the number of etchings (time), that is, the number of times of the etching carried out.

It may be seen from FIG. 7 that the etching rate initially varies suddenly, but thereafter enters a stable region. FIG. 7 shows a case where the etching is carried out for 1 minute for each time of the etching carried out. In FIG. 7, it may be seen that the etching rate after 10 etchings is approximately ½ the initial etching rate.

Figure 8:
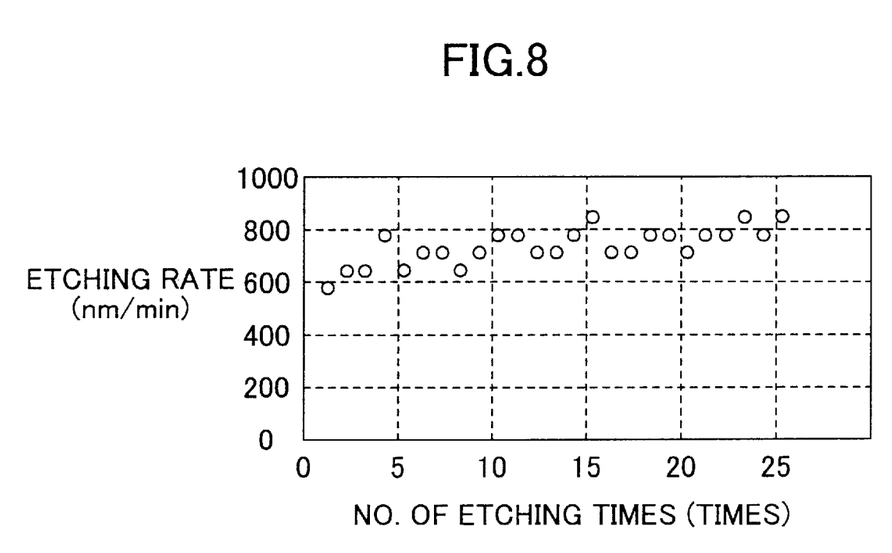
FIG. 8 is a diagram for explaining a dependency of the etching rate on a number of times of the etching carried out when the etching of the polyimide layer which does not involve exposure of a Au layer is repeated.

FIG. 8 is a diagram for explaining a dependency of the etching rate on a number of times of the etching carried out when the etching of the polyimide layer which does not involve exposure of a Au layer or the like at the surface of the source/drain electrode is repeated. In FIG. 8, the ordinate indicates the etching rate (nm/min), and the abscissa indicates the number of etching times (times), that is, the number of times of the etching carried out.

It may be seen from FIG. 8 that the etching rate does not vary suddenly.

From a comparison of FIGS. 7 and 8, it may be regarded that the sudden variation in the initial etching rate is caused due to the Au layer 65 which forms the source/drain electrode 63 and is exposed during the etching process carried out with respect to the polyimide layer 69. In other words, since the Au layer 65 is exposed during the etching process carried out with respect to the polyimide layer 69 to form the contact hole 70, it may be regarded that the exposed portion of Au scatters into the etching reaction chamber 81 to cause deterioration of the etching rate.

The tendency of the etching rate varying suddenly when the Au is exposed can similarly be observed for other metals which are exposed, such as Pt, Cu and Al.

SUMMARY OF THE INVENTION

Accordingly, it is a general object of the present invention to provide a novel and useful semiconductor device producing method in which the problems described above are eliminated.

Another and more specific object of the present invention is to provide a semiconductor device producing method which can prevent variation of the etching rate and to realize an etching having a satisfactory reproducibility.

Still another object of the present invention is to provide a semiconductor device producing method comprising a first step which carries out an etching process during a time between a start and an end of a plasma etching, the etching process being selected from a group consisting of an etching process which includes no exposing of a specific metal which affects variation of an etching rate, an etching process which includes no positioning of the specific metal exposed from an etching mask, an etching process which includes exposing of the specific metal located at a surface other than an etching target surface of a semiconductor substrate, and an etching process which includes exposing of the specific metal having a thickness smaller than a thickness of other etching targets regardless of an existence of the etching mask; and a second step which carries out a plasma etching with respect to a specific metal as a pre-processing prior to the etching process of the first step. According to the semiconductor device producing method of the present invention, it is possible to suppress a sudden variation in the etching rate caused by scattering of the specific metal and to realize an extremely fine etching (processing) having a satisfactory reproducibility, because the pre-processing for introducing the specific metal into an etching reaction chamber is carried out prior to the etching process which exposes the specific metal. As a result, it is possible to improve the integration density and the reliability of electronic devices such as semiconductor devices.

A further object of the present invention is to provide a semiconductor device producing method comprising a first step which carries out an etching process during a time between a start and an end of a plasma etching, the etching process being selected from a group consisting of an etching process which includes no exposing of a specific metal which affects variation of an etching rate, an etching process which includes no positioning of the specific metal exposed from an etching mask, an etching process which includes exposing of the specific metal located at a surface other than an etching target surface of a semiconductor substrate, and an etching process which includes exposing of the specific metal having a thickness smaller than a thickness of other etching targets regardless of an existence of the etching mask; and a second step which introduces a gas including the specific metal into an etching reaction chamber as a pre-processing prior to the etching process of the first step. According to the semiconductor device producing method of the present invention, it is possible to suppress a sudden variation in the etching rate caused by scattering of the specific metal and to realize an extremely fine etching (processing) having a satisfactory reproducibility, because the pre-processing for introducing the specific metal into an etching reaction chamber is carried out prior to the etching process which exposes the specific metal. As a result, it is possible to improve the integration density and the reliability of electronic devices such as semiconductor devices.

Another object of the present invention is to provide an electronic device producing method comprising a first step which carries out an etching process during a time between a start and an end of a plasma etching, the etching process being selected from a group consisting of an etching process which includes no exposing of a specific metal which affects variation of an etching rate, an etching process which includes no positioning of the specific metal exposed from an etching mask, an etching process which includes exposing of the specific metal located at a surface other than an etching target surface of a substrate, and an etching process which includes exposing of the specific metal having a thickness smaller than a thickness of other etching targets regardless of an existence of the etching mask; and a second step which carries out a plasma etching with respect to a specific metal as a pre-processing prior to the etching process of the first step. According to the electronic device producing method of the present invention, it is possible to suppress a sudden variation in the etching rate caused by scattering of the specific metal and to realize an extremely fine etching (processing) having a satisfactory reproducibility, because the pre-processing for introducing the specific metal into an etching reaction chamber is carried out prior to the etching process which exposes the specific metal. As a result, it is possible to improve the integration density and the reliability of electronic devices such as semiconductor devices.

Still another object of the present invention is to provide an electronic device producing method comprising a first step which carries out an etching process during a time between a start and an end of a plasma etching, the etching process being selected from a group consisting of an etching process which includes no exposing of a specific metal which affects variation of an etching rate, an etching process which includes no positioning of the specific metal exposed from an etching mask, an etching process which includes exposing of the specific metal located at a surface other than an etching target surface of a substrate, and an etching process which includes exposing of the specific metal having a thickness smaller than a thickness of other etching targets regardless of an existence of the etching mask; and a second step which introduces a gas including the specific metal into an etching reaction chamber as a pre-processing prior to the etching process of the first step. According to the electronic device producing method of the present invention, it is possible to suppress a sudden variation in the etching rate caused by scattering of the specific metal and to realize an extremely fine etching (processing) having a satisfactory reproducibility, because the pre-processing for introducing the specific metal into an etching reaction chamber is carried out prior to the etching process which exposes the specific metal. As a result, it is possible to improve the integration density and the reliability of electronic devices such as semiconductor devices.

Other objects and further features of the present invention will be apparent from the following detailed description when read in conjunction with the accompanying drawings.

DESCRIPTION OF THE PREFERRED EMBODIMENTS

Figure 9:
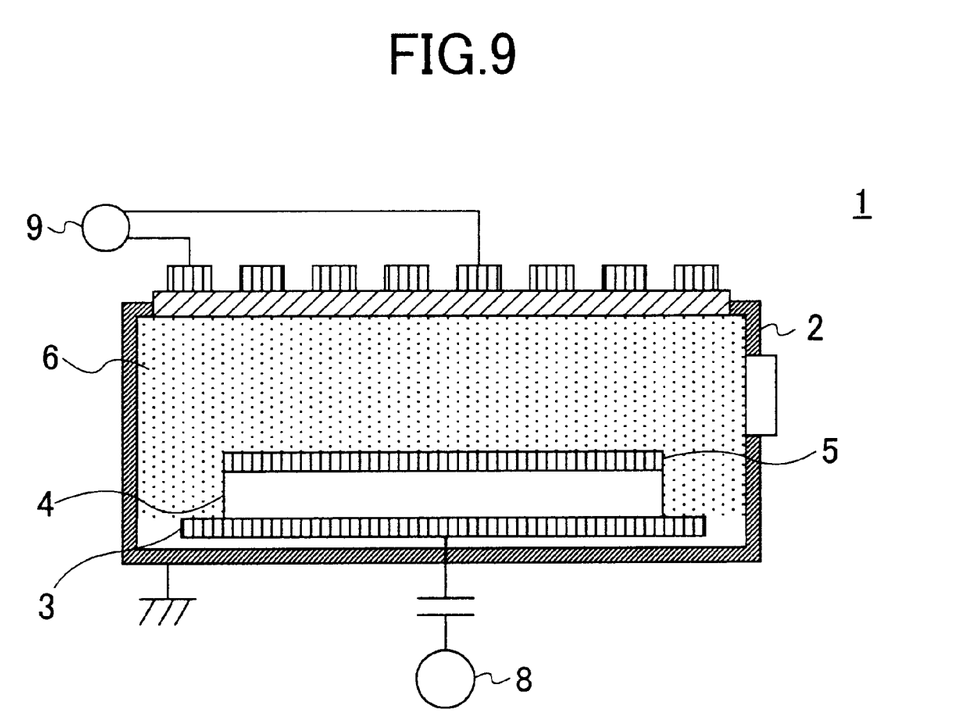
FIG. 9 is a cross sectional view for explaining an operating principle of the present invention.

First, a description will be given of an operating principle of the present invention, by referring to FIG. 9. FIG. 9 is a cross sectional view for explaining the operating principle of the present invention. In FIG. 9, an etching apparatus 1 includes an etching reaction chamber 2, a stage 3 provided in the etching reaction chamber 2, a bias RF power supply 8, and an excitation RF power supply 9. A dummy substrate 4 is placed on the stage 3, and a specific metal 5 is formed on the dummy substrate 4. Plasma 6 of Ar gas is generated within the etching reaction chamber 2, as will be described later.

According to a first aspect of the present invention, a semiconductor device producing method comprises a first step which carries out an etching process during a time between a start and an end of a plasma etching, the etching process being selected from a group consisting of an etching process which includes no exposing of a specific metal which affects variation of an etching rate, an etching process which includes no positioning of the specific metal exposed from an etching mask, an etching process which includes exposing of the specific metal located at a surface other than an etching target surface of a semiconductor substrate, and an etching process which includes exposing of the specific metal having a thickness smaller than a thickness of other etching targets regardless of an existence of the etching mask; and a second step which carries out a plasma etching with respect to a specific metal 5 as a pre-processing prior to the etching process of the first step.

By carrying out the plasma etching using the plasma 6 with respect to the specific metal 5 by the pre-processing, it is possible to scatter the specific metal 5 within the reaction chamber 2. As a result, it is possible to suppress the affection of scattering of the exposed specific metal during the etching process and to stabilize the etching rate, thereby realizing an etching having a high reproducibility.

The plasma etching employed in the present invention includes Ar ion milling which generate plasma from Ar gas.

In the first aspect of the present invention, the second step may carry out the plasma etching with respect to the specific metal provided on a dummy substrate 4 in the pre-processing.

By using the dummy substrate 4 provided with the specific metal 5, it is possible to scatter the specific metal 5 by the same process as the conventional running process, and the etching rate can be stabilized without increasing the number of production processes.

According to a second aspect of the present invention, a semiconductor device producing method comprises a first step which carries out an etching process during a time between a start and an end of a plasma etching, the etching process being selected from a group consisting of an etching process which includes no exposing of a specific metal which affects variation of an etching rate, an etching process which includes no positioning of the specific metal exposed from an etching mask, an etching process which includes exposing of the specific metal located at a surface other than an etching target surface of a semiconductor substrate, and an etching process which includes exposing of the specific metal having a thickness smaller than a thickness of other etching targets regardless of an existence of the etching mask; and a second step which introduces a gas including the specific metal into an etching reaction chamber 2 as a pre-processing prior to the etching process of the first step.

The scattering of the specific metal within the etching reaction chamber 2 can be made in this manner using the gas including the specific metal. As a result, it becomes unnecessary to prepare a dummy substrate or wafer.

In the second aspect of the present invention, the second step may generate plasma after introducing the gas including the specific metal into the etching reaction chamber 2 by the pre-processing.

By generating the plasma 6 from the gas including the specific metal, it is possible to scatter the specific metal within the etching reaction chamber 2 by a simple process.

In the first or second aspect of the present invention, the specific metal subject to the first step and the specific metal subject to the pre-processing may be the same metal. Alternatively, the specific metal subject to the first step and the specific metal subject to the pre-processing may be mutually different metals.

The effect of stabilizing the etching rate can be obtained regardless of whether the specific metal subjected to the pre-processing and the specific metal subject to the first step are the same or are mutually different.

In addition, the specific metals may respectively be selected from a group consisting of Au, Pt, Cu and Al. However, the specific metals are of course not limited to the metals within this group. The present invention is similarly applicable to other specific metals which display a sudden variation in the etching rate of the etching process.

In the first or second aspect of the present invention, the semiconductor device producing method may further comprise a third step which carries out a cleaning process with respect to an etching apparatus 1, where the pre-processing of the second step is carried out between the cleaning process of the third step and the etching process of the first step.

When processing the same lot, it is effective to carry out the pre-processing between the cleaning process which precedes the etching process and the etching process.

In the first or second aspect of the present invention, the first step may carry out the etching process a plurality of times, and the pre-processing of the second step may be carried out between the plurality of etching processes of the first step.

When processing the lot which includes no exposing of the specific metal or the lot which includes no specific metal, continuously with the lot which includes exposing of the specific metal, the pre-processing may be carried out between the etching process with respect to the lot which includes no exposing of the specific metal or the etching process with respect to the lot which includes no specific metal and the etching process with respect to the lot which includes exposing of the specific metal.

In the first or second aspect of the present invention, the second step may carry out a high-density plasma etching as the pre-processing.

In addition, in the first or second aspect of the present invention, the high-density plasma etching may be selected from a group consisting of an induced combination plasma etching, an electron cyclotron resonance etching, a magnetron reactive ion etching, and a VHF etching.

The sudden variation in the etching rate is particularly notable in the induced combination plasma (ICP) etching, electron cyclotron resonance (ECR) etching, magnetron reactive ion etching (MRIE), and VHF etching which uses the VHF band or the UGF band. Hence, the present invention is particularly effective when applied to such etching techniques.

In the first or second aspect of the present invention, the semiconductor device producing method may further comprise a third step which carries out the plasma etching a plurality of times after the pre-processing.

Since the etching rate becomes stable for a relatively long time by the pre-processing, it is possible to realize an etching having a high reproducibility even when the plasma etching is carried out a plurality of times after the pre-processing.

In the first or second aspect of the present invention, an etching target of the etching process of the first step may include the specific metal and at least another material, and a thickness of the specific metal removed by the etching process may be smaller than a thickness of the other material removed by the etching process.

Generally, the running process prior to the etching process etches the material having the largest amount of etching in the etching process. Hence, in a case where the thickness of the specific metal is large, the specific metal is etched during the running process. Accordingly, the present invention is effective when the thickness of the specific metal removed by the etching is smaller than the thickness of the other materials.

In the first or second aspect of the present invention, the semiconductor device producing method may further comprise a third step which exposes the specific metal which is patterned prior to the etching process, during the time between the start and the end of the plasma etching.

In the first or second aspect of the present invention, a thickness of the specific metal which is patterned may be larger than a thickness of a layer removed by the etching process.

In the first or second aspect of the present invention, the specific metal which is patterned may be exposed from a sidewall of the etching mask in the etching process.

In the first or second aspect of the present invention, the specific metal which is patterned may be used as the etching mask in the etching process.

In the first or second aspect of the present invention, the specific metal which is patterned may be a wiring pattern or an electrode pattern.

In the first or second aspect of the present invention, the specific metal which is patterned may be an alignment mark or an identification mark.

In the first or second aspect of the present invention, the specific metal which is patterned may be arranged outside a chip region on the semiconductor substrate.

A specific metal which is patterned prior to the etching process is affected similarly to the exposed specific metal. Hence, the present invention may be applied to the specific metal exposed from the sidewall of the etching mask during the etching process, the specific metal which is used as the etching mask, the wiring pattern, the electrode pattern, the alignment mark or the identification mark. In addition, the specific metal may be arranged outside the chip region on the semiconductor substrate.

Furthermore, since ordinarily, no running process is carried out with respect to the specific metal, the pre-processing of the present invention is also effective when applied to a case where the thickness of the patterned specific metal is larger than the thickness of the layer removed during the etching process.

In the first or second aspect of the present invention, the specific metal which is patterned may be arranged in a peripheral portion on the semiconductor substrate.

In the first or second aspect of the present invention, the specific metal which is patterned may be arranged on a scribing line on the semiconductor substrate.

In a case where the patterned specific metal is arranged outside the chip region on the semiconductor substrate, the patterned specific metal may be located at the peripheral portion on the semiconductor substrate or on the scribing line on the semiconductor substrate.

In the first or second aspect of the present invention, the specific metal located at the surface other than the etching target surface of the semiconductor substrate may be arranged on a side surface of the semiconductor substrate.

In the first or second aspect of the present invention, the specific metal located at the surface other than the etching target surface of the semiconductor substrate may arranged on a surface of the semiconductor substrate opposite from the etching target surface.

The pre-processing of the present invention is effective even in a case where the specific metal is located on a surface other than the etching target surface of the semiconductor substrate, such as the side surface or the bottom surface of the semiconductor substrate.

In the first or second aspect of the present invention, a thickness of the specific metal prior to the etching in the pre-processing may be larger than a thickness of the specific metal removed during the etching process.

In the case where the specific metal is located on a surface other than the etching target surface of the semiconductor substrate, such as the side surface or the bottom surface of the semiconductor substrate, the pre-processing of the present invention can still be applied even if the thickness of the specific metal prior to the etching is larger than the thickness of the specific metal removed during the etching process, because no running process is carried out with respect to the specific metal.

Next, a description will be given of a first embodiment of the semiconductor device producing method according to the present invention, by referring to FIGS. 10 through 13.

FIGS. 10 through 13 are cross sectional views for explaining this first embodiment of the semiconductor device producing method.

Figure 10:
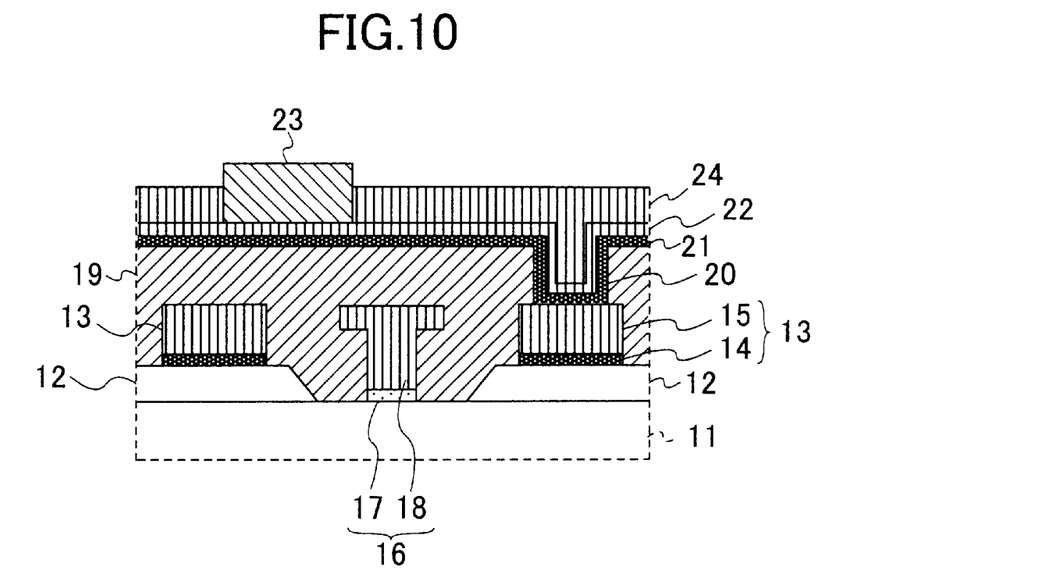
FIG. 10 is a cross sectional view for explaining a first embodiment of a semiconductor device producing method according to the present invention.

In FIG. 10, an i-type AlGaAs buffer layer (not shown) having a thickness of 200 nm, for example, is formed on a semiinsulating GaAs substrate (not shown), and an i-type InGaAs electron transit layer (not shown) having a thickness of 25 nm, for example, is formed on the i-type AlGaAs buffer layer. An n-type AlGaAs electron supply layer 11 having an impurity concentration of $5 \times 10^{18}$ cm$^{-3}$ and a thickness of 25 nm, for example, and an n-type GaAs cap layer 12 having an impurity concentration of $2 \times 10^{18}$ cm$^{-3}$ and a thickness of 50 nm, for example, are successively grown epitaxially on the i-type InGaAs electron transit layer. A source/drain electrode 13 made up of a AuGe layer 14 having a thickness of 30 nm, for example, and a Au layer 15 having a thickness of 300 nm, for example, is formed on the n-type GaAs cap layer 12. After forming a gate recess region, a T-shaped gate electrode 16 made up of a Pt layer 17 having a thickness of 10 nm, for example, and a Au layer 18 having a thickness of 400 nm, for example, is formed on the n-type AlGaAs electron supply layer 11. A polyimide layer 19 is provided as an interlayer insulation layer on the entire surface of the structure described above, as shown in FIG. 10.

The polyimide layer 19 is selectively etched by an induced combination plasma (ICP) etching, so as to form a contact hole 20 which reaches the source/drain electrode 13. Thereafter, a TiW layer 21 having a thickness of 100 nm, for example, and a Au seed layer 22 having a thickness of 100 nm, for example, are successively formed by sputtering. The TiW layer 21 is provided as a barrier metal, and the Au seed layer 22 is provided as a plating seed. An electroplating is carried out using a resist pattern 23 as a plating frame, so as to selectively form a Au wiring layer 24 having a thickness of 1 μm, for example.

Figure 11:
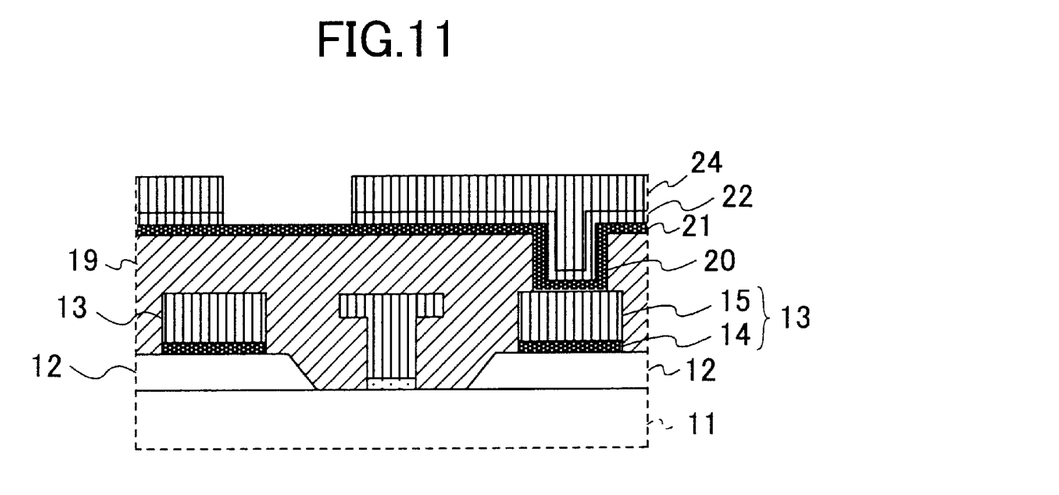
FIG. 11 is a cross sectional view for explaining the first embodiment of the semiconductor device producing method according to the present invention.

In FIG. 11, an ion milling apparatus is used to carry out an Ar ion milling at an acceleration voltage of 400 V and a pressure of 1.0 Pa, so as to remove the Au seed layer 22 which is exposed in a region where no Au wiring layer 24 is provided.

Figure 12:
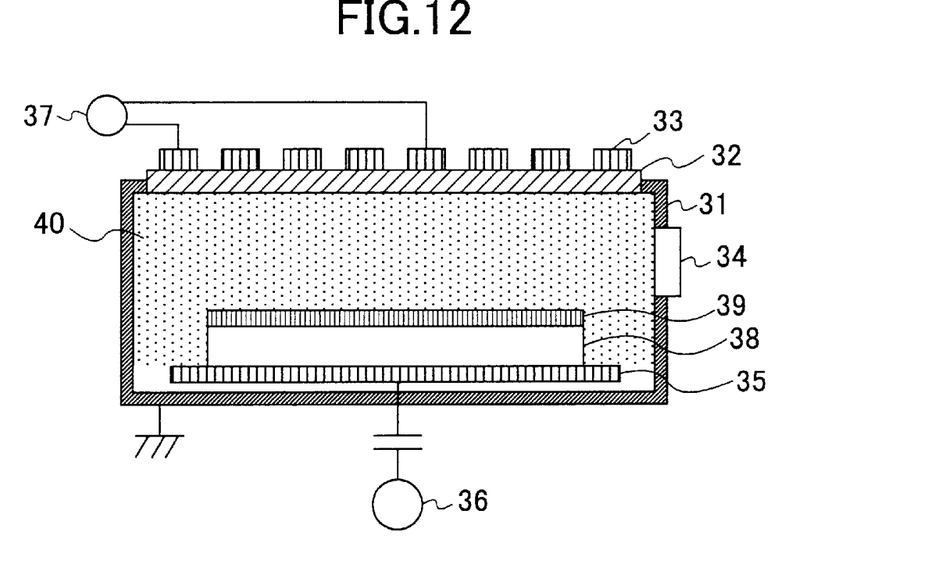
FIG. 12 is a cross sectional view for explaining the first embodiment of the semiconductor device producing method according to the present invention.

In FIG. 12, an ICP etching apparatus is cleaned, and the ICP etching apparatus is run using a dummy wafer 38 which is provided with a Au layer 39 on top thereof.

The ICP etching apparatus used may be the same as the ICP etching apparatus shown in FIG. 3. The ICP etching apparatus includes an etching reaction chamber 31 which is provided with a quartz plate 32 for supporting a planar coil 33 and a quartz window 34 which forms an observation port. A stage 35, which is also functions as an electrode on which the sample is placed, is accommodated within the etching reaction chamber 31.

An internal volume of the etching reaction chamber 31 is approximately 50 liters, for example. In addition, an area of the stage 35 which also functions as the electrode is approximately 80 cm$^2$.

The etching reaction chamber 31 is grounded, and a high-frequency power for plasma excitation is applied to the planar coil 33 from an excitation RF power supply 37. On the other hand, a bias power from a bias RF power supply 36 is applied to the stage 35.

During this running process, a high-frequency power of 400 W for plasma excitation is applied to the planar coil 33 from the excitation RF power supply 37, a bias power of 50 W from the bias RF power supply 36 is applied to the stage 35, and a $SF_6$ gas is introduced into the etching reaction chamber 31 so as to generate the plasma under a pressure of 2.0 Pa, for example. A 60-second plasma etching is carried out for each dummy wafer 38, and the plasma etching is carried out in this manner with respect to 10 dummy wafers 38.

Figure 13:
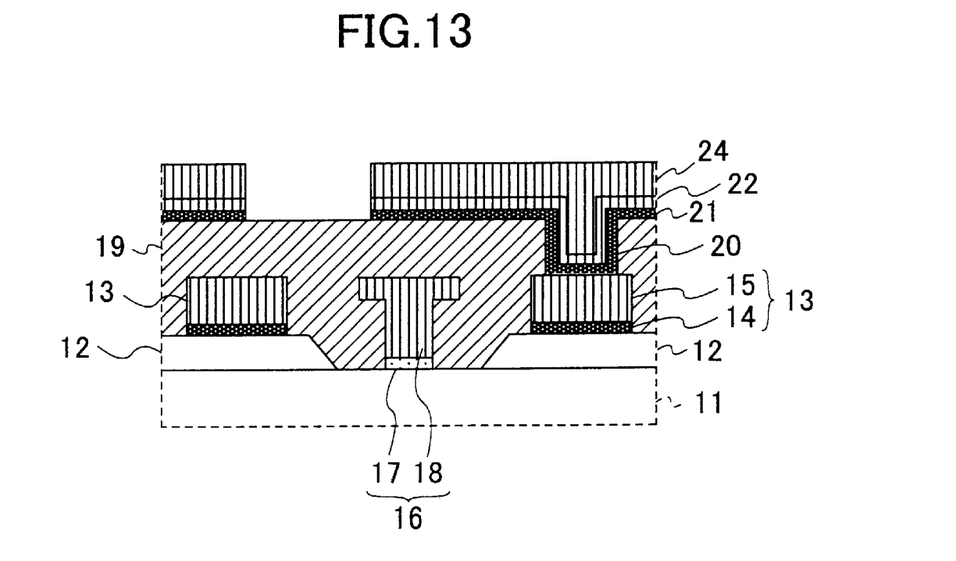
FIG. 13 is a cross sectional view for explaining the first embodiment of the semiconductor device producing method according to the present invention.

Thereafter, the dummy wafer 38 is removed from the etching reaction chamber 31, and the semiconductor wafer having the exposed portion of the TiW layer 21 is placed on the stage 35. Then, a $SF_6$ gas is introduced into the etching reaction chamber 31 and plasma is generated by the excitation RF power supply 37. Hence, the exposed TiW layer 21 is selectively etched by the generated plasma, so as to separate the Au wiring layer 24 into portions which are electrically isolated from each other as shown in FIG. 13.

According to this first embodiment, it was confirmed by the present inventor that a sudden variation, to the extent of affecting the reproducibility of the etching, does not occur in the etching rate, even after the etching process with respect to the TiW layer 21 which forms the barrier metal is carried out for approximately 3000 semiconductor wafers.

Next, a description will be given of a second embodiment of the semiconductor device producing method according to the present invention, by referring to FIGS. 14 and 15.

Figure 14:
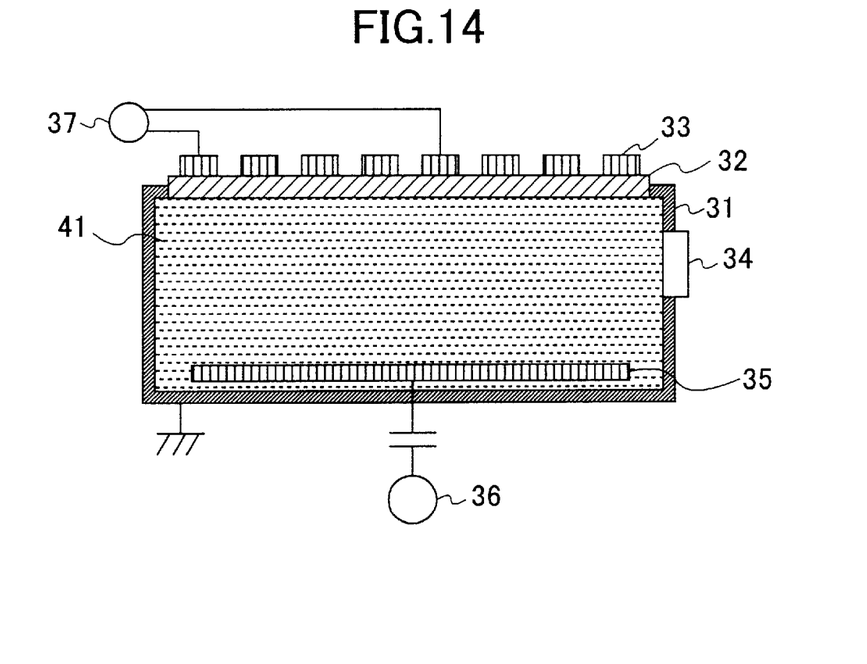
FIG. 14 is a cross sectional view for explaining a second embodiment of the semiconductor device producing method according to the present invention.
Figure 15:
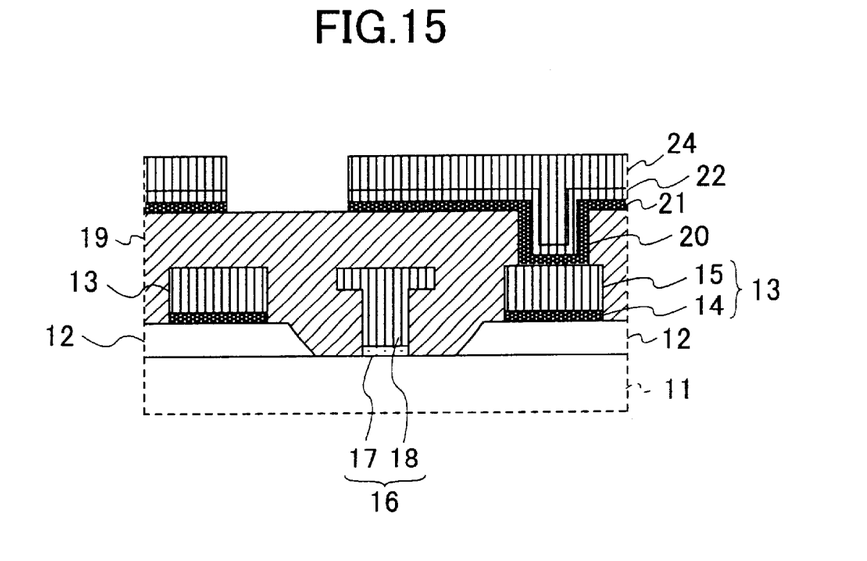
FIG. 15 is a cross sectional view for explaining the second embodiment of the semiconductor device producing method according to the present invention.

FIGS. 14 and 15 are cross sectional views for explaining this second embodiment of the semiconductor device producing method. In FIGS. 14 and 15, those parts which are the same as those corresponding parts in FIGS. 10 through 13 are designated by the same reference numerals, and a description thereof will be omitted.

First, the processes described above in conjunction with FIGS. 10 and 11 are carried out similarly to the first embodiment, so as to form the Au wiring layer 24 by the selective plating, and to remove the exposed portion of the Au seed layer 22.

In FIG. 14, the ICP etching apparatus used may be the same as the ICP etching apparatus shown in FIG. 12. A gas having trimethylgold (TMAu) added to a cleaning gas made up of $O_2+N_2$ is introduced into the etching reaction chamber 31 of the ICP etching apparatus. In addition, a high-frequency power of 400 W for plasma excitation is applied to the planar coil 33 from the excitation RF power supply 37, and a bias power of 50 W from the bias RF power supply 36 is applied to the stage 35. Discharge is made for 10 minutes under a pressure of 2.0 Pa, for example, so as to generate the plasma in the etching reaction chamber 31. In this case, the ratio of the flow rates of the gasses is $O_2:N_2:TMAu=50:50:3$, for example.

Nextly, a shown in FIG. 15, the exposed portion of the TiW layer 21 is removed under the same condition as in the first embodiment described above in conjunction with FIG. 13, so as to separate the Au wiring layer 24 into portions which are electrically isolated from each other.

According to this second embodiment, it was confirmed by the present inventor that a sudden variation, to the extent of affecting the reproducibility of the etching, does not occur in the etching rate, even after the etching process with respect to the TiW layer 21 which forms the barrier metal is carried out for approximately 3000 semiconductor wafers.

In each of the embodiments described above, the Au wiring layer is exposed as the etching mask, and thus, the pre-processing is carried out using the dummy wafer provided with a Au layer. However, the sudden variation in the etching rate is similarly observed when the exposed metal is other than Au, such as Pt, Cu and Al. Hence, when the exposed metal is Pt, Cu or Al, the pre-processing may be carried out similarly to the case where the exposed metal is Au, by using a dummy wafer provided with a Pt, Cu or Al layer.

The effects of the exposed metal layer made of Au or the like not only occur when the exposed metal layer acts as an etching mask, but also occur when a wiring layer is formed on the entire surface of a structure by sputtering or the like and the wiring layer is patterned by an etching using a resist pattern.

In this case, after the resist pattern is used as a mask and a milling process is carried out to remove the Au wiring layer, for example, the TiW barrier metal is removed by a plasma etching. By in the process of etching the TiW barrier metal, the end portions of the Au wiring layer exposed at an opening affects the variation of the etching rate. Hence, the pre-processing of the present invention is also effective when applied to such a case.

In addition, the affection of Au similarly occur in the case of a Au electrode exposed at a bottom portion of a contact hole or in the case of a Au wiring layer. Accordingly, the pre-processing of the present invention is also effective when applied to an etching process with respect to an interlayer insulation layer which exposes Au.

The means described heretofore solve the problems of the etching in the chip region on the semiconductor substrate. However, the affection on the etching rate of Au or the like similarly occur for the Au or the like existing in regions other than the chip region on the semiconductor substrate. Accordingly, a description will be given of a third embodiment of the semiconductor device producing method according to the present invention, by referring to FIGS. 16 through 20.

Figure 16:
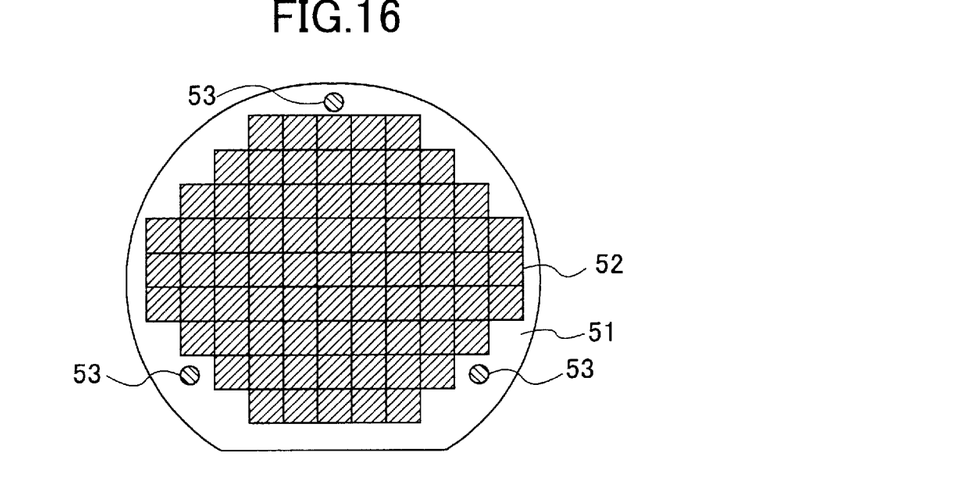
FIG. 16 is a plan view for explaining a semiconductor wafer which is processed by a third embodiment of the semiconductor device producing method according to the present invention.

FIG. 16 is a plan view for explaining a semiconductor wafer which is processed as an etching target according to the third embodiment of the semiconductor device producing method. FIGS. 17 through 20 are cross sectional views for explaining the third embodiment of the semiconductor device producing method. In FIG. 19, those parts which are the same as those corresponding parts in FIG. 12 are designated by the same reference numerals, and a description thereof will be omitted.

In FIG. 16, chips 52 are arranged at a central region on a GaAs wafer 51. Power supply pads 53 which are used for forming a Au wiring layer or the like by electroplating are arranged at a peripheral portion on the GaAs wafer 51.

Figure 17:
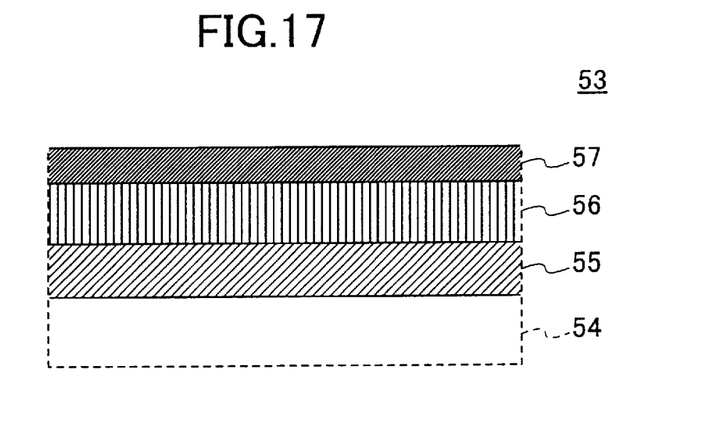
FIG. 17 is a cross sectional view for explaining the semiconductor wafer which is processed by the third embodiment of the semiconductor device producing method according to the present invention.

FIG. 17 schematically shows a cross section of the power supply pad 53. In FIG. 17, an n-type GaAs cap layer 54 is provided on an uppermost surface of the GaAs wafer 51, and a Au power supply pad 56 is provided on the n-type GaAs cap layer 54 via an interlayer insulation layer 55 made of $SiO_2$ or the like. For example, a polyimide layer 57 which becomes an upper interlayer insulator layer covers the top of the Au power supply pad 56.

Figure 18:
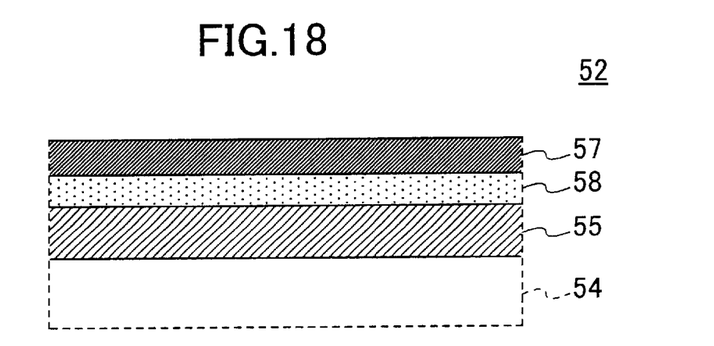
FIG. 18 is a cross sectional view for explaining the semiconductor wafer which is processed by the third embodiment of the semiconductor device producing method according to the present invention.
Figure 19:
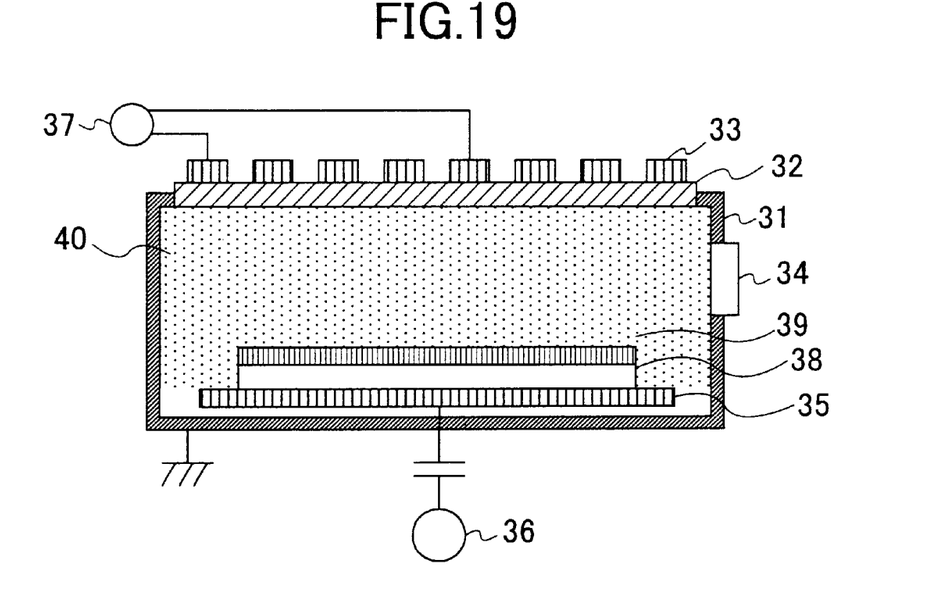
FIG. 19 is a cross sectional view for explaining the third embodiment of the semiconductor device producing method according to the present invention.

FIG. 18 schematically shows a cross section of a part of a resistor forming region of the chip 52. In FIG. 18, the n-type GaAs cap layer 54 is provided on an uppermost surface of the GaAs wafer 51, and a WSi resistor layer 58 is provided on the n-type GaAs cap layer 54 via the interlayer insulation layer 55 made of $SiO_2$ or the like. For example, the polyimide layer 57 which becomes an upper interlayer insulator layer covers the top of the WSi resistor layer 58.

Figure 20:
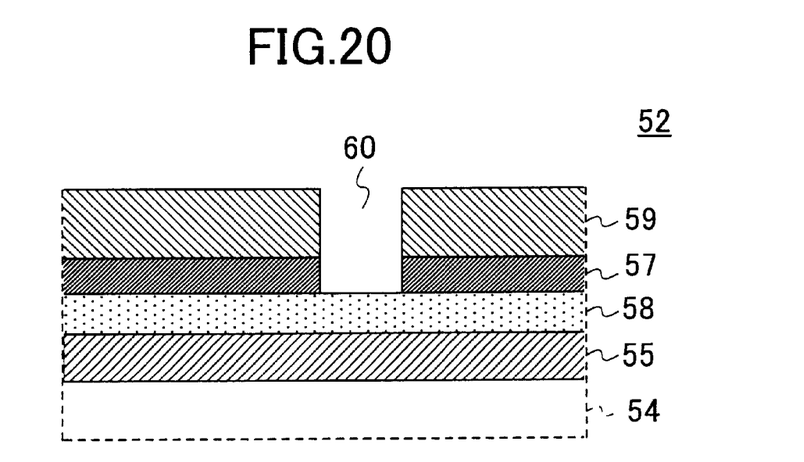
FIG. 20 is a cross sectional view for explaining the third embodiment of the semiconductor device producing method according to the present invention.

Referring to FIGS. 17, 18 and 20, when forming a contact hole in the polyimide layer 57 reaching the WSi resistor layer 58 which is provided on the GaAs wafer 51, the polyimide layer 57 at the power supply pad 53 is also removed during the process of forming this contact hole, to thereby expose the Au power supply pad 56. The surface of the Au power supply pad 56 is slightly etched by an over-etching, thereby causing Au to scatter within the etching reaction chamber 31 and to vary the etching rate of the polyimide layer 57.

Accordingly, as shown in FIG. 19, the dummy wafer 38 provided with the Au layer 39 is used similarly to the first embodiment described above, and a $SF_6$ gas is introduced into the etching reaction chamber 31, so as to carry out a running process using the generated plasma 40.

In this case, the $SF_6$ gas is introduced into the etching reaction chamber 31 so as to generate the plasma under a pressure of 2.0 Pa, for example. A 60-second plasma etching is carried out for each dummy wafer 38, and the plasma etching is carried out in this manner with respect to 10 dummy wafers 38.

Next, the dummy wafer 38 is removed from the etching reaction chamber 31, and a GaAs wafer 51 provided with a resist pattern 59 is placed on the stage 35. Then, a $SF_6$ gas is introduced into the etching reaction chamber 31 and plasma is generated by the excitation RF power supply 37. Hence, the exposed polyimide layer 57 is selectively etched by the generated plasma, so as to form a contact hole 60 as shown in FIG. 20.

According to this third embodiment, the running process which etches the Au layer is carried out prior to the etching of the polyimide layer 57. Hence, it is possible to realize an etching having a high reproducibility even when the etching of the polyimide layer 57 is carried out a large number of times.

Moreover, in the patterning process with respect to the WSi resistor layer or the like in the third embodiment described above, a thin Au protection layer may be provided on the surface of the WSi resistor layer. In a case where such a thin Au protection layer is to be etched together with the WSi resistor layer, the running process etches the WSi resistor layer which is the main etching target. Hence, it is possible to prevent the variation of the etching rate of the WSi resistor layer by etching the Au layer in the pre-processing.

In the third embodiment described above, the pre-processing is carried out to etch the Au, so as to suppress the affection of the Au layer existing outside the chip region. But the Au layer existing outside the chip region is of course not limited to the power supply pad, and the pre-processing of the present invention is effective to suppress the affection of the Au or the like existing at a location which is originally not the target of the running process.

For example, a metal such as Au may be used for an alignment mark or an identification mark provided in the chip region. In addition, a metal such as Au may be adhered unintentionally on a stepped scribing line. Moreover, a metal layer such as Au may be adhered unintentionally on the side surface of the bottom (or rear) surface of the wafer. The pre-processing of the present invention is also effective when applied to such cases.

The meal provided on the dummy wafer which is to be subjected to the pre-processing does not need to be the same as the metal which is exposed in the etching process. In other words, the sudden variation in the etching rate can be suppressed, regardless of which one of the metals Au, Pt, Cu and Al is provided on the dummy wafer used for the pre-processing and regardless of which one of the metals Au, Pt, Cu and Al is exposed in the etching process.

The etching carried out in the pre-processing is not limited to the ICP etching described in the embodiments. For example, a high-density plasma etching may be carried out as the pre-processing. This high-density plasma etching may be selected from a group consisting of an induced combination plasma (ICP) etching, an electron cyclotron resonance (ECR) etching, a magnetron reactive ion etching (MRIE), and a VHF etching.

In the described embodiments, it is a precondition that the etching process is carried out with respect to the same lot. Hence, the pre-processing is carried out between the cleaning process and the etching process. However, when the etching process is carried out with respect to mutually different lots, the pre-processing may be carried out between a plurality of etching processes.

For example, when processing a lot which includes no exposing of a specific metal such as Au, Pt, Cu and Al or a lot which includes no specific metal such as Au, Pt, Cu and Al, continuously with a lot which includes exposing of the specific metal such as Au, Pt, Cu and Al, the pre-processing may be carried out between the etching process with respect to the lot which includes no exposing of the specific metal or the etching process with respect to the lot which includes no specific metal and the etching process with respect to the lot which includes exposing of the specific metal.

The gas used includes TMAu in the second embodiment described above. However, it is possible to use an organic metal such as trimethylaluminum (TMAl) as the constituent element in place of the TMAu. Such an organic metal may be bubbled and introduced into the etching reaction chamber.

In the third embodiment, the polyimide layer is the etching target. However, the etching target is not limited to the polyimide layer, and the present invention may be applied similarly to the etching process in which a sudden variation occurs in the etching rate, and an etching gas introduced into the etching reaction chamber may be selected appropriately depending on the etching target.

The etching process of the described embodiment is used as a process of removing the barrier metal or a process of forming the contact hole. However, the present invention is similarly applicable to the etching process in general, wherein the Au, Pt, Cu or Al is not exposed at the initial stage of the etching process but the Au, Pt, Cu or Al is exposed by the time of the etching process ends.

In the described embodiment, it is assumed for the sake of convenience that the semiconductor substrate (wafer), which is the etching target, is used for a Group III–V compound semiconductor device having high electron mobility transistors (HEMTs). However, the present invention is similarly applicable to group III–V compound semiconductor devices having other devices formed thereon. Furthermore, the present invention is also similarly applicable to a silicon semiconductor device.

The present invention is not limited to the semiconductor device producing method, The producing method of the present invention is similarly applicable to an etching process of an electronic device such as a dielectric device, and an etching process of a assembling circuit board.

Further, the present invention is not limited to these embodiments, but variations and modifications may be made without departing from the scope of the present invention.

What is claimed is:

1. A semiconductor device producing method comprising:
   a first step which carries out an etching process during a time between a start and an end of a plasma etching, said etching process being selected from a group consisting of an etching process which includes no exposing of a first specific metal which affects variation of an etching rate, an etching process which includes no positioning of the first specific metal exposed from an etching mask, an etching process which includes exposing of the first specific metal located at a surface other than an etching target surface of a semiconductor substrate, and an etching process which includes exposing of the first specific metal having a thickness smaller than a thickness of other etching targets regardless of an existence of the etching mask; and a second step which carries out a plasma etching with respect to a second specific metal as a pre-processing prior to the etching process of said first step.

2. The semiconductor device producing method as claimed in claim 1, wherein said second step carries out the plasma etching with respect to the second specific metal provided on a dummy substrate by said pre-processing.

3. The semiconductor device producing method as claimed in claim 1, wherein the first specific metal subject to the first step and the second specific metal subject to the pre-processing are the same metal.

4. The semiconductor device producing method as claimed in claim 3, wherein the first and second specific metals are selected from a group consisting of Au, Pt, Cu and Al.

5. The semiconductor device producing method as claimed in claim 1, wherein the first specific metal subject to the first step and the second specific metal subject to the pre-processing are mutually different metals.

6. The semiconductor device producing method as claimed in claim 5, wherein the mutually different metals are respectively selected from a group consisting of Au, Pt, Cu and Al.

7. The semiconductor device producing method as claimed in claim 1, further comprising:

a third step which carries out a cleaning process with respect to an etching apparatus, said pre-processing of said second step being carried out between the cleaning process of said third step and the etching process of said first step.

8. The semiconductor device producing method as claimed in claim 1, wherein said first step carries out the etching process a plurality of times, and said pre-processing of said second step is carried out between the plurality of etching processes of said first step.

9. The semiconductor device producing method as claimed in claim 1, wherein said second step carries out a high-density plasma etching as the pre-processing.

10. The semiconductor device producing method as claimed in claim 9, wherein the high-density plasma etching is selected from a group consisting of an induced combination plasma etching, an electron cyclotron resonance etching, a magnetron reactive ion etching, and a VHF etching.

11. The semiconductor device producing method as claimed in claim 1, further comprising:

a third step which carries out the plasma etching a plurality of times after the pre-processing.

12. The semiconductor device producing method as claimed in claim 1, wherein an etching target of the etching process of said first step includes the first specific metal and at least another material, and a thickness of the first specific metal removed by the etching process is smaller than a thickness of the other material removed by the etching process.

13. The semiconductor device producing method as claimed in claim 1, further comprising:

a third step which exposes the first specific metal which is patterned prior to the etching process, during the time between the start and the end of the plasma etching.

14. The semiconductor device producing method as claimed in claim 13, wherein a thickness of the first specific metal which is patterned is larger than a thickness of a layer removed by the etching process.

15. The semiconductor device producing method as claimed in claim 13, wherein the first specific metal which is patterned is exposed from a sidewall of the etching mask in the etching process.

16. The semiconductor device producing method as claimed in claim 13, wherein the first specific metal which is patterned is used as the etching mask in the etching process.

17. The semiconductor device producing method as claimed in claim 13, wherein the first specific metal which is patterned is a wiring pattern or an electrode pattern.

18. The semiconductor device producing method as claimed in claim 13, wherein the first specific metal which is patterned is an alignment mark or an identification mark.

19. The semiconductor device producing method as claimed in claim 13, wherein the first specific metal which is patterned is arranged outside a chip region on the semiconductor substrate.

20. The semiconductor device producing method as claimed in claim 13, wherein the first specific metal which is patterned is arranged in a peripheral portion on the semiconductor substrate.

21. The semiconductor device producing method as claimed in claim 13, wherein the first specific metal which is patterned is arranged on a scribing line on the semiconductor substrate.

22. The semiconductor device producing method as claimed in claim 1, wherein the first specific metal located at the surface other than the etching target surface of the semiconductor substrate is arranged on a side surface of the semiconductor substrate.

23. The semiconductor device producing method as claimed in claim 22, wherein a thickness of the first specific metal prior to the etching in the pre-processing is larger than a thickness of the first specific metal removed during the etching process.

24. The semiconductor device producing method as claimed in claim 1, wherein the first specific metal located at the surface other than the etching target surface of the semiconductor substrate is arranged on a surface of the semiconductor substrate opposite from the etching target surface.

25. The semiconductor device producing method as claimed in claim 24, wherein a thickness of the first specific metal prior to the etching in the pre-processing is larger than a thickness of the first specific metal removed during the etching process.

26. A semiconductor device producing method comprising:

a first step which carries out an etching process during a time between a start and an end of a plasma etching, said etching process being selected from a group consisting of an etching process which includes no exposing of a first specific metal which affects variation of an etching rate, an etching process which includes no positioning of the first specific metal exposed from an etching mask, an etching process which includes exposing of the first specific metal located at a surface other than an etching target surface of a semiconductor substrate, and an etching process which includes exposing the first specific metal having a thickness smaller than a thickness of other etching targets regardless of an existence of the etching mask; and a second step which introduces a gas including a second specific metal into an etching reaction chamber as a pre-processing prior to the etching process of said first step.

27. The semiconductor device producing method as claimed in claim 26, wherein said second step generates plasma after introducing the gas including the second specific metal into the etching reaction chamber by the pre-processing.

28. An electronic device producing method comprising:

a first step which carries out an etching process during a time between a start and an end of a plasma etching, the etching process being selected from a group consisting of an etching process which includes no exposing of a specific metal which affects variation of an etching rate, an etching process which includes no positioning of the specific metal exposed from an etching mask, an etching process which includes exposing of the specific metal located at a surface other than an etching target surface of a substrate, and an etching process which includes exposing of the specific metal having a thickness smaller than a thickness of other etching targets regardless of an existence of the etching mask; and a second step which carries out a plasma etching with respect to a specific metal as a pre-processing prior to the etching process of the first step.

* * * * *